United States Patent [19]

Jacquet et al.

[11] Patent Number: 5,961,848
[45] Date of Patent: Oct. 5, 1999

[54] PROCESS FOR PRODUCING MAGNETORESISTIVE TRANSDUCERS

[75] Inventors: Jean-Claude Jacquet, Orsay; Thierry Valet, Viroflay, both of France

[73] Assignee: Thomson-CSF, Paris, France

[21] Appl. No.: 08/669,376

[22] PCT Filed: Nov. 10, 1995

[86] PCT No.: PCT/FR95/01484

§ 371 Date: Jul. 10, 1996

§ 102(e) Date: Jul. 10, 1996

[87] PCT Pub. No.: WO96/15461

PCT Pub. Date: May 23, 1996

[30] Foreign Application Priority Data

Nov. 10, 1994 [FR] France ................................. 94 13549

[51] Int. Cl.$^6$ ........................................................ B44C 1/22
[52] U.S. Cl. .......................... 216/22; 29/603.01; 360/113
[58] Field of Search ...................... 216/2, 22; 29/603.01; 360/113

[56] References Cited

U.S. PATENT DOCUMENTS 5,446,613   8/1995   Rottmayer ............................... 360/113

OTHER PUBLICATIONS

Gijs et al. "Perpendicular Giant Magnetoresistance of Microstructured Fe/Cr Magnetic Multilayers from 4.2 to 300 K"; "1993 The American Physical Society", pp. 3343–3346.

Primary Examiner—R. Bruce Brenemar
Assistant Examiner—Shamim Ahmed
Attorney, Agent, or Firm—Oblon, Spivak, McClelland, Maier & Neustadt, P.C.

[57] ABSTRACT

A process for producing magnetoresistive transducers, using microlithographic techniques, where the transducers have magnetic metallic multilayers deposited by sputtering or by molecular beam epitaxy, and forming columns whose side walls will be covered with an insulation and whose tops will be free of this insulation, such that a current is able to flow in the magnetoresistive transducers perpendicular to the plane of the layers so as to exploit a phenomenon of perpendicular giant magnetoresistance. This process includes a step of producing, on one surface of a substrate, a stack including a first conductive layer in contact with a substrate and successive magnetic layers and non-magnetic metallic layers constituting a magnetic metallic multilayer in contact with the conductive layer. The process also includes steps of producing a second conductive layer on the magnetic metallic multilayer, producing a first resin mask having the dimensions of a magnetoresistive sensitive element to be produced and etching, around the mask, the second conductive layer and the magnetic metallic multilayer. Subsequently, the process includes steps of depositing an insulation layer removing the resin mask with the insulation layer lying on the resin mask, and forming an electrical contact on the second conductive layer.

20 Claims, 9 Drawing Sheets

SECTION BB

SECTION BB

SECTION AA

PROCESS FOR PRODUCING MAGNETORESISTIVE TRANSDUCERS

BACKGROUND OF THE INVENTION

1. Field of the Invention

The invention relates to a process for producing a magnetoresistive transducer and more particularly a magnetoresistive transducer having perpendicular transport.

The process of the invention furthermore makes it possible to produce a large number of these transducers in the same step, which transducers may or may not be connected together.

2. Discussion of the Background

In the various fields of application of thin-film magnetoresistive materials (read head for magnetic recording, magnetometers, compasses, various types of sensors, etc.), all the components are nowadays produced with thin layers of magnetic alloys such as "Permalloy": Ni80Fe20.

The discovery of a giant magnetoresistive effect in magnetic metallic multilayers [1] was described, for example, in the document by M. N. Baibich et al., Physical Review Letters 61, p 2472, 1989 and in the document by T. Valet et al, Applied Physics Letters 61, p 3187, 1992. It is already accepted that these materials exhibit superior performance compared to those of magnetic alloys used hitherto.

The physical origin of this effect resides in the spin dependence of the scattering of carriers in magnetic metals and their alloys (see the document by A. Campbell et al., "Transport Properties of Ferromagnets" which appeared in Ferromagnetic Material, published by Wohlfarth, Amsterdam, 1982, vol 3) and in the existence of two magnetic states in these multilayers: a state in which the magnetizations of the magnetic layers all point in the same direction and which will be denoted P and the other state in which the magnetizations are alternately in one direction and then in the other and which will be denoted AP.

Switching from one state of alignment to the other causes a variation in the resistivity which may be written in the form:

$$\rho^{AP} = \rho^P (1+\alpha) \quad [1]$$

Two types of geometry are possible, the first denoted CIP (the one which has been studied most) in which the current $I_0$ flows parallel to the layers (see FIG. 1A), and the second denoted CPP in which the current $I_{90}$ flows perpendicularly to the layers (see FIG. 1B).

As has been demonstrated by theoretical work (see the document by T. Valet et al., Physical Review, B 48, No. 10, p 7099, 1993) and experimental work (see the document by W. P. Pratt, Physical Review Letters, 66, p 3060, 1991), the second configuration is potentially more promising. Nevertheless, the difficulties encountered when implementing it have limited its study.

In order to clarify this point, it is necessary to calculate not the resistivity variation $\alpha$ of the multilayer, which is an intrinsic variation, but that of the total resistance which is the experimentally accessible quantity.

The resistance R of an object of resistivity $\rho$, of cross-section S and of length l is expressed in the following manner:

$$R = \rho l / S \quad [2]$$

For a set of resistances in series, the total resistance will be the sum of all these resistances. Thus, in both the abovementioned cases (CIP and CPP), denoting by $R_m$ the resistance of the multilayer, by $R_f$ that of the current leads and by $R_c$ that resulting from the contact between the multilayer and these leads, the total resistance is given by:

$$R_t = 2R_c + R_m + 2R_f \quad [3]$$

In the general case in which the lines of current $I_\theta$ make an angle $\theta$ with respect to the planes of the layers (FIGS. 1a and 1b), the resistance variation associated with the situations on switching from a P to an AP state or conversely may be written, from the formulae [1] to [3]:

$$a_G = \alpha_m / (1 + 2R_f / 2_m + 2R_c / R_m) \quad [4]$$

where $\alpha_m = \beta \alpha_m CPP + (1-\beta) \alpha_m CIP$ $\beta$ being such that $\beta=1$ if $\theta=\pi/2$ and $\beta=0$ if $\theta=0$ $$\alpha_m^G = \frac{\varphi_m^{G,AP} - \rho_m^{G,P}}{\varphi_m^{G,P}}$$

$\phi_m^{G,AP}$ means resistivity in the antiparallel state of the CIP or CPP geometry for the magnetic layer, $\phi_m^{G,P}$ means resistivity in the parallel state of the CIP or CPP geometry for the magnetic layer.

It is therefore apparent from the formulae [4] that the measured variation $a_G$ is a mixture of the effects obtained in the two geometries.

In addition, these formulae show that the value of the measured effect is attenuated by the contact resistances and by the resistances of the current leads, this attenuation depending, from the formulae [2] and [3], on:

the geometrical dimensions of the electrical contacts;

those of the multilayer;

the resistivities; and the quality of the contacts.

Thus, in order to get at the intrinsic value $\alpha_m$ of the effect, which is the maximum variation which it is possible to obtain, it is necessary to decrease the resistance ratio $(R_f + R_c)/R_m$ and, in order to decouple the $\alpha_m$ CIP and $\alpha_m$ CPP effects, to produce a structure in which the lines of current are parallel (CIP case) or perpendicular (CPP case) to the planes of the layers.

This may be achieved in two ways, one by varying the geometrical dimensions of the various elements of the structure, the other by modifying the resistivities of its constituent parts.

In the CIP case (FIG. 1a), it is very easy to obtain the intrinsic effect $\alpha_m$ CIP. To do this, it is sufficient to increase the distance travelled by the current in the multilayer (parameter $L_m$), into a serpentine structure for example. On the other hand, in the CPP case (FIG. 1b), this length is limited to the thickness of the multilayer and it is then necessary to vary the other parameters if it is desired to get close to the intrinsic variation $\alpha_m$ CPP.

Another major problem resulting from this geometry is the low value of the resistance due to the multilayer.

This has two consequences:

a small drop in potential, not very compatible with applications;

a measurement perturbed by the various sources of noise (especially thermal noise).

In order to specify an order of magnitude of these values, assuming that the contact resistance is perfect and that the lines of current are virtually parallel to the plane of the layers in the CIP case and virtually perpendicular in the CPP case, let us compare them in the two geometries and take the case in which the electrical contacts are made of copper and in which the multilayer consists of permalloy and copper (see the document by T. Valet et al., Applied Physics Letters, 61, p 3187, 1992).

We then have, from FIGS. 1a and 1b and the formulae [2] to [4]:

$$a_{CIP} = \alpha_m \text{CIP}/(1 + 2\rho_f L_f S_m / \rho^p_m L_m S_f)$$

$$a_{CPP} = \alpha_m \text{CPP}/(1 + 2\rho_f e_f S_m / \rho^p_m e_m S_f)$$

where $\rho_f \approx 3\mu\Omega$ cm, $\rho_m \approx 30\mu\Omega$ cm
and in the case where $S_f \approx S_m \approx 1\ \mu m^2$
we obtain $$a_{CIP} = \alpha_m \text{CIP}/(1 + 0.2 L_f / L_m)$$

$$a_{CPP} = \alpha_m \text{CPP}/(1 + 0.2 e_f / e_m)$$

In the CIP case, we have, easily:
$L_m = 10$ mm, $L_f = 1$ mm $\Rightarrow a_{CIP} \approx \alpha_m$
$R_t = R_m = 300\ \Omega$
In the CPP case, typical values are:
$e_m \approx e_f/10 = 0.1\ \mu m \Rightarrow a_{CPP} = \alpha_m/3$;
we therefore get at only one third of the effect, and for the ideal case in which $a_{CPP} = \alpha_m$:
$R_t = R_m = 0.03\ \Omega$
we therefore have, in the CPP case, a resistance which is smaller by four orders of magnitude compared to the CIP case.

In the CPP case, there are therefore two problems to be solved which are:

to obtain a measurable resistance: $R_t$ to get at the maximum variation: $\alpha_m$CPP.

One of the solutions developed for remedying these various problems uses superconducting contacts made of niobium (see the document by W. P. Pratt et al., Physical Review Letters, 66, p 3060, 1991). Although this approach makes it possible to get round the resistances of the current leads, it requires the use of low temperature (4.2 K.), which limits the advantage thereof for the abovementioned applications.

A more technological approach has been developed and described in the document by M. A. M. Gijs et al., Applied Physics Letters, 63, p 111, 1993. This approach consists in reducing the cross-section $S_m$ of the multilayer using the techniques available in microlithography.

FIG. 2a illustrates the structure fabricated by this technique. Firstly, by masking and exposure to ultraviolet radiation, a square pattern is printed in a photosensitive resin deposited on the stack of materials in which it is desired to machine the block 1 (here, a multilayer 2 deposited on a gold layer 3). After machining the block, the resin is dissolved in an acetone bath. Next, the whole assembly is covered with a photosensitive material 4 (polyimide) which serves as an insulation. Next, an aperture, obtained by exposure to ultraviolet radiation located above the pillar, is made in this insulation. Finally, immediately after having cleaned the thus-revealed surface, a gold layer 5 is deposited on the entire structure (contacting).

In this technique, there is a strong correlation between the cross-section of the pillars, the thickness of the conductive layers surrounding the latter and that part of the measured resistance coming from this column. The results obtained show that, for a conductor thickness of less than two micrometres and for cross-sections of less than about ten square micrometres, that part of the resistance of the column may become very low. In order to remedy this, a trench 6 is made on either side of the block, as depicted in FIG. 2b (view from above of FIG. 2a). The measured resistance is then that of the pillar, and is independent of the values of the thicknesses and cross-sections.

However, this technology has many drawbacks.

On the one hand, the structure thus fabricated has a high contact resistance due to the necessity of using a photosensitive material as insulation which, when cleaning the top of the blocks, is pulled off and redeposited on this surface.

On the other hand, the necessity, when opening a window in the top of the contacting studs or when producing the trench, of being positioned with an accuracy at least equal to that of their diameters, makes this step difficult for cross-sections of a few square micrometres. In addition, it appears to be difficult to cut a trench vertically in line with the pillar deviations $\Delta x$ and $\Delta y$ in FIG. 2b).

SUMMARY OF THE INVENTION

The subject of the present invention is a fabrication process which remedies the drawbacks enumerated above.

It consists in keeping the resin which has served for etching the pattern, then in depositing on this assembly an insulating material and finally in using this resin to remove (using a lift-off technique) the insulation deposited on the top of the studs. This solution thus makes it possible, using the same resin and therefore a single masking, to machine the pillars and their insulations and remove the insulation deposited on their tops, and also makes it possible to use a non-organic insulation ($Al_2O_3$, for example) which is more resistant to the cleaning process. In this way, we eliminate the alignment and contamination problems resulting from the solution developed in the Philips laboratories.

In an improved version of the invention, these pillars may be produced in two steps, by the crossing of two lines, the intersection of the two lines determining the position of the pillar. This procedure, which makes lift-off of the resin (after depositing the insulation) easier, will enable pillars of small cross-section and a trench in the lower conductor to be produced. This trench will enable the multilayer to be deposited on a conductive layer of small thickness for which the growth occurs better, this being so, as was demonstrated by the Philips' engineers [9], without reducing the measured resistance variation.

BRIEF DESCRIPTION OF THE DRAWING

The invention will be easier to understand on reading the description which follows, given by way of non-limiting example with reference to the appended drawings in which.

DESCRIPTION OF THE PREFERRED EMBODIMENTS

First of all, a simplified embodiment of the invention will be described with reference to FIGS. 4c to 4e.

First of all, a first layer of a conductive material 8 is produced on a substrate 10, followed by a magnetic metallic multilayer 7. This multilayer is an alternation of magnetic layers and non-magnetic layers. The non-magnetic layers may be made of metallic material.

Figure 1A:
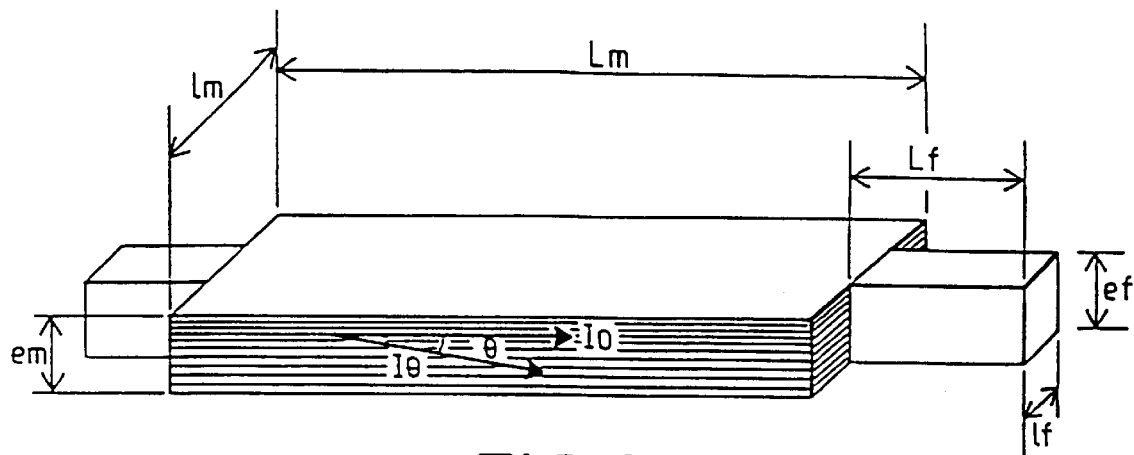
FIGS. 1A and 1B respectively show conventional CIP and CPP magnetic metallic multilayer structures.
Figure 1B:
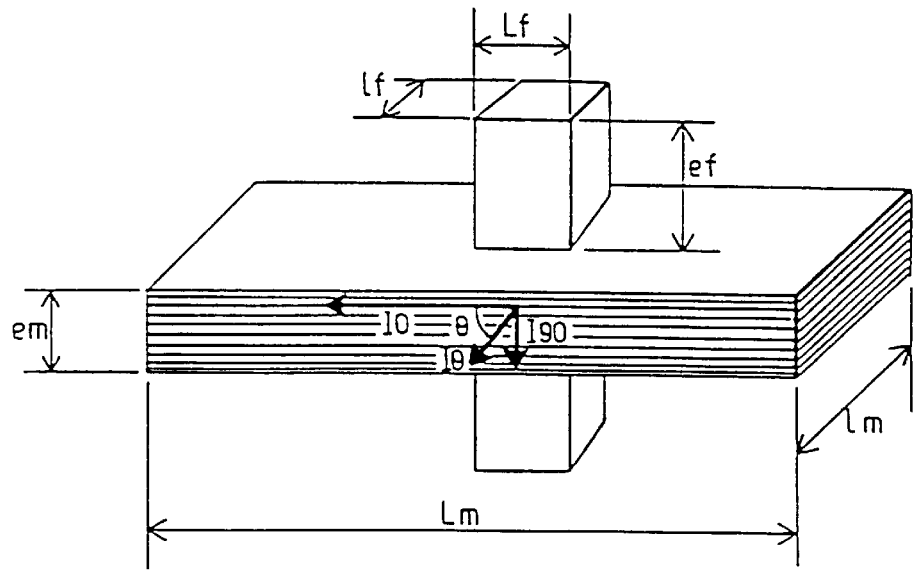
Figure 2A:
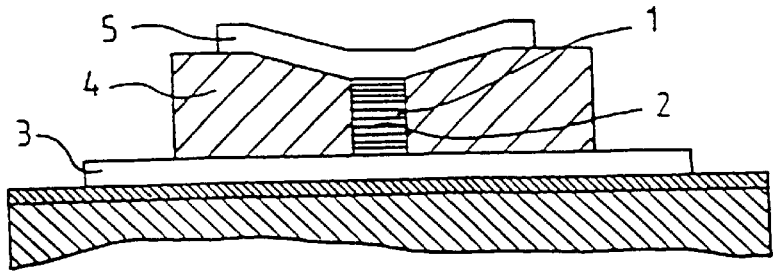
FIGS. 2A and 2B illustrate conventional multilayer structures manufactured using microlithography.
Figure 2B:
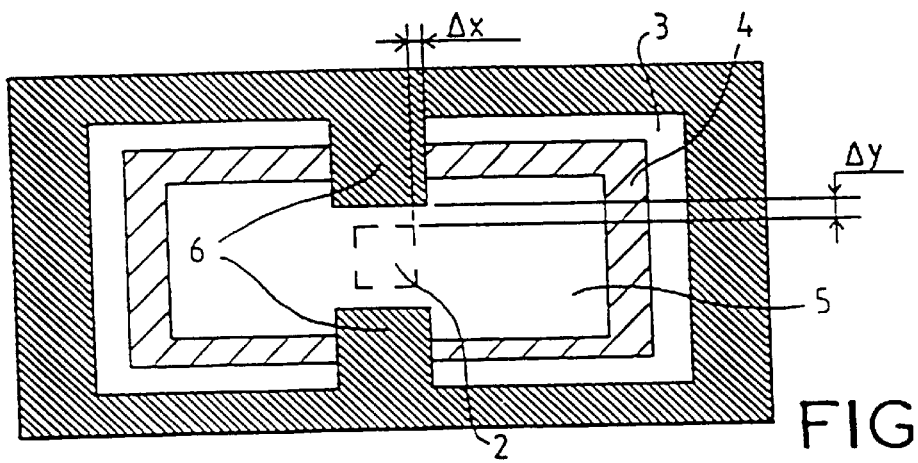
Figure 3A:
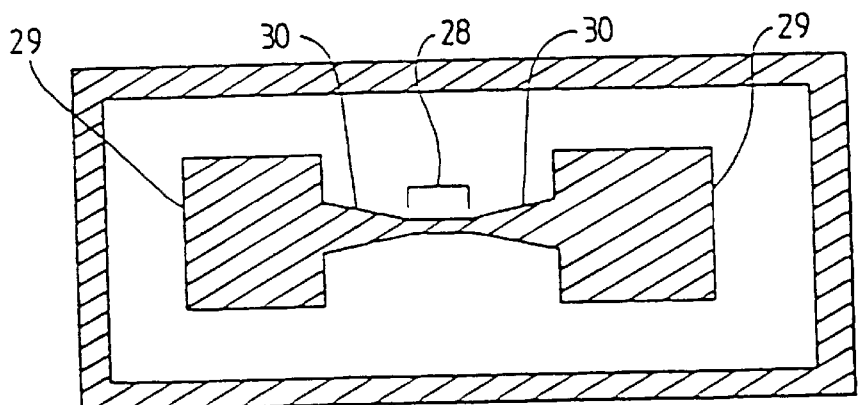
FIGS. 3A–3B respectively represent masks used in a photolithography manufacturing process according to the present invention.
Figure 3B:
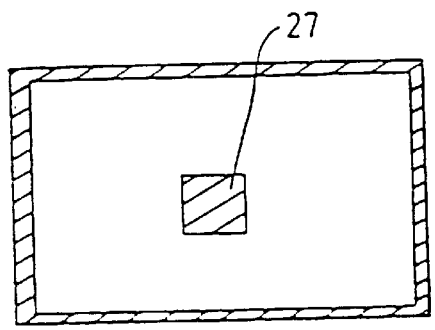

A second layer of a conductive material 9 is produced on the multilayer 7. Next, as shown in FIG. 4c, a mask 12 made of resin is produced on the layer 9, the mask having the shape of the transducer element to be produced. FIG. 3b shows an example of such a mask.

Next, the layers 9, 7, and partly the layer 8, are etched around the mask 12. The entire structure is covered with a layer of insulating material 15, as shown in FIG. 4d.

The procedure continues with the removal of the resin layer constituting the mask 12, as well as the insulating material lying above the mask. The structure shown in FIG. 4e is thus obtained.

Finally, a contacting layer 21 is deposited on the upper part of the structure and enables contact to be made with the conductive layer 9.

By solving the problems mentioned above, the production process according to the invention thus makes it possible to produce a magnetoresistive transducer.

The process of the invention will now be described in more detail.

The diagrams 5a to 5o illustrate, using sectional views and plan views, a few of the steps in the process of the invention. In these figures, we have shown the production of a single pillar on an assembly consisting of a magnetic multilayer 7 sandwiched between two layers of conductive materials, called lower conductor 8 and upper conductor 9, the whole being deposited on a silicon substrate 10, the silicon possibly being oxidized (silicon oxide layer 11). This production is described in the case in which the pillar is obtained by crossing two lines. The techniques employed and the concatenation of the various steps, given by way of example, are as follows:

Firstly, a stack of layers, conductive layer 8, multilayer 7 and conductive layer 9, is firstly produced on a substrate 10.

Next, during a first operation, a first line is defined in these layers.

Figure 5A:
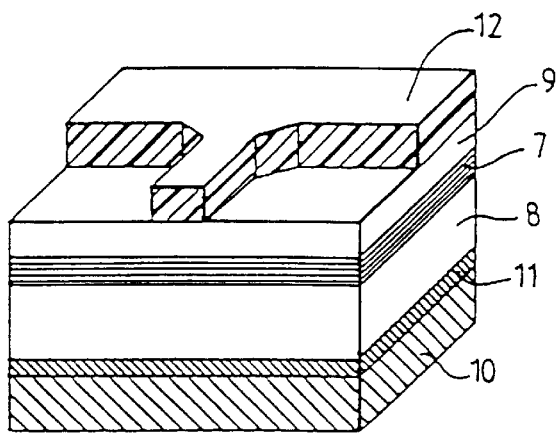
FIGS. 5A–5O successively present sectional and plans views of manufacturing steps according to the present invention.
Figure 5B:
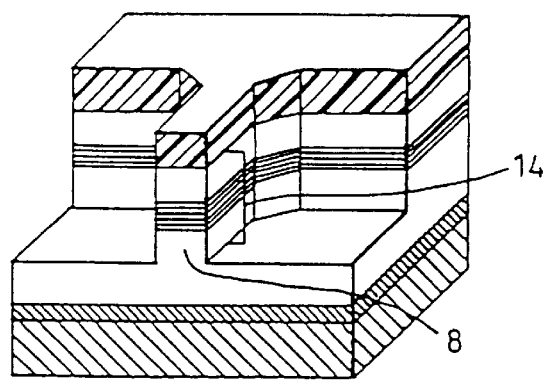
Figure 5C:
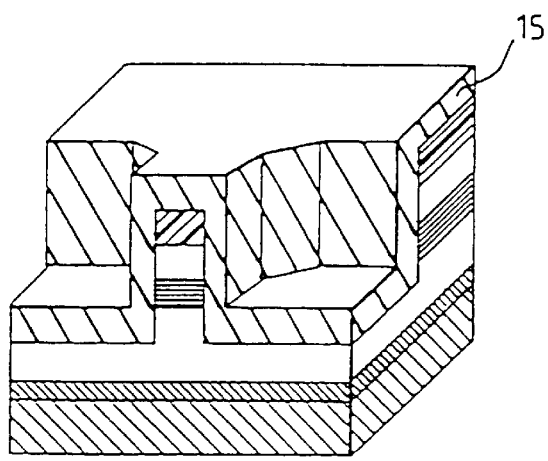
Figure 5D:
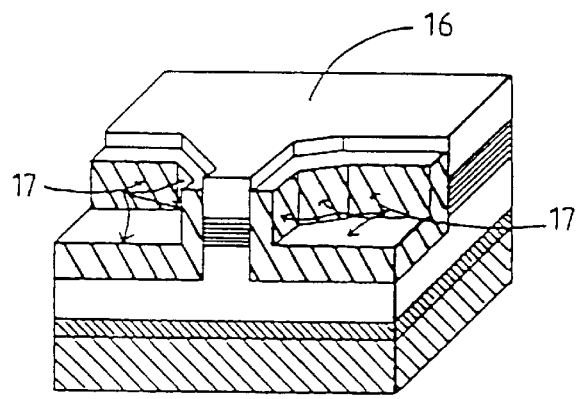
Figure 5E:
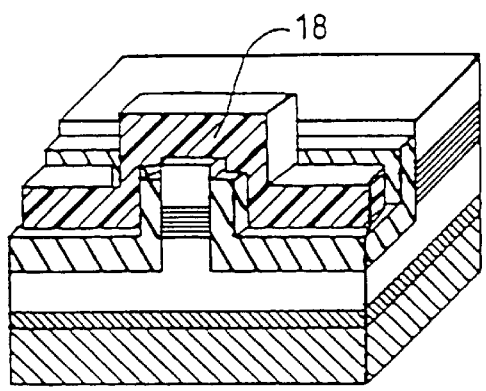

This operation comprises:
- definition in a photosensitive resin 12 of the pattern to be etched in this assembly. This may be achieved using the techniques available in lithography (resin coating, masking, etc.). FIGS. 5a and 5k illustrate this step, the mask 12 used is shown in plan view in FIG. 3a. It includes a straight part 13;
- a first etching 14, for example using ion machining (FIGS. 5b and 5k). In this example, the etching was carried out down to half the lower conductor 8 but it could be down to any other thickness (from zero thickness to the total thickness), the thickness of the resin 12 being such that a continuous layer of it remains after etching;
- the deposition of the first insulation layer 15 (for example alumina), for example by sputtering (FIG. 5c);
- the removal of the remaining resin (lift-off) after the first etching (FIGS. 5d and 5l), this operation consisting in removing the resin by immersing the substrate in a solvent, such as acetone, optionally in the presence of ultrasound so as to facilitate the procedure (the thickness of the resin being sufficient to allow this step to take place properly). The effect of this is to strip the surface 16 of all insulation and to leave the surfaces 17 covered with insulation.

During a second operation, a second line (part 19 in the resin 18, FIG. 5m) is defined.

We repeat the preceding operations, but this time the second line 19 to be etched in the material makes an angle γ(here, γ=90 degrees) with respect to the first line 14. FIG. 5e corresponds to masking using the mask 18. FIG. 5m is a plan view of the structure after etching the second line in the case in which this second etching was carried out:
- down to half the lower conductor 8 for that part of the surface 16 which is not covered by the resin of the second masking;
- down to two-thirds of the first insulation layer for that part of the surfaces 17 which is not covered by the resin of the second masking (Example 1).

Figure 5F:
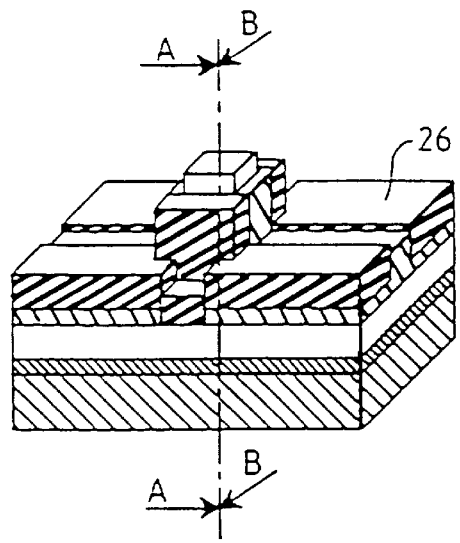
Figure 5G:
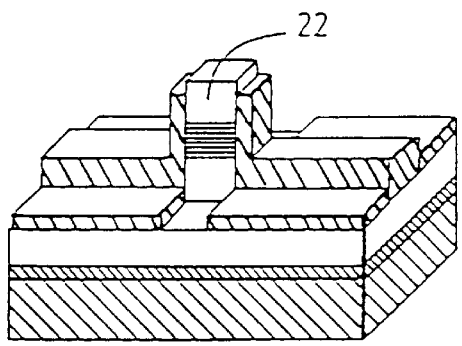
Figure 5H:
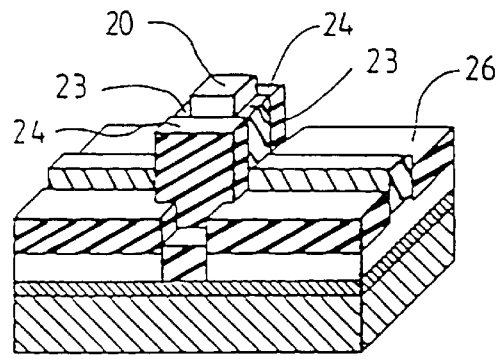
Figure 5I:
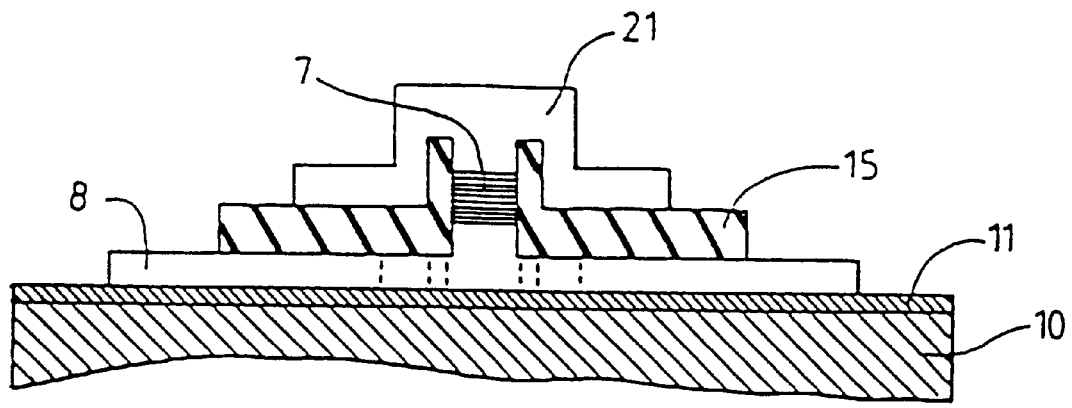
Figure 5J:
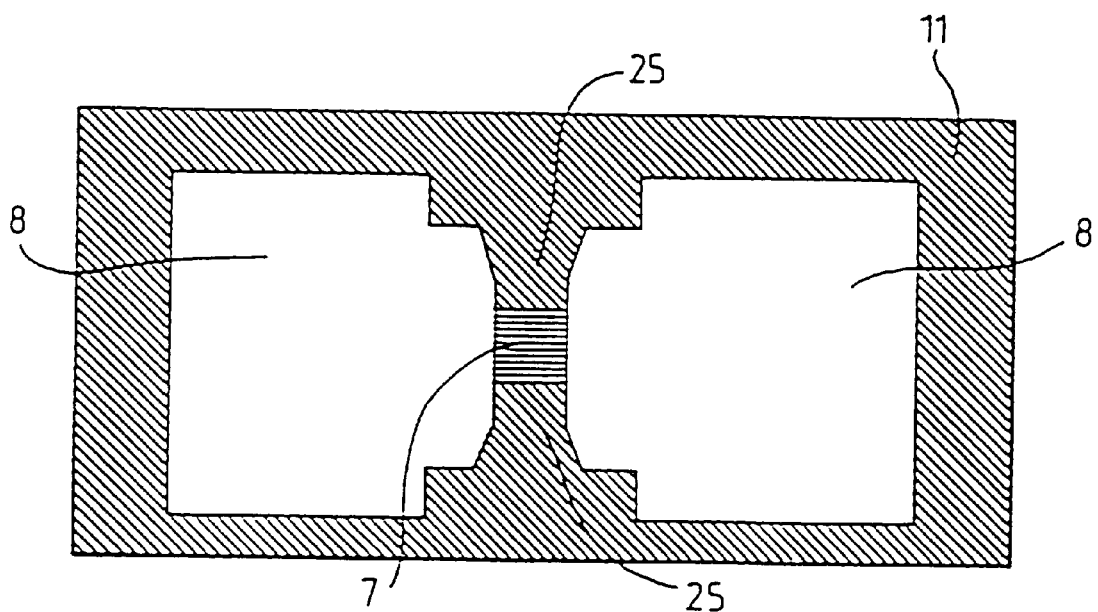
Figure 5K:
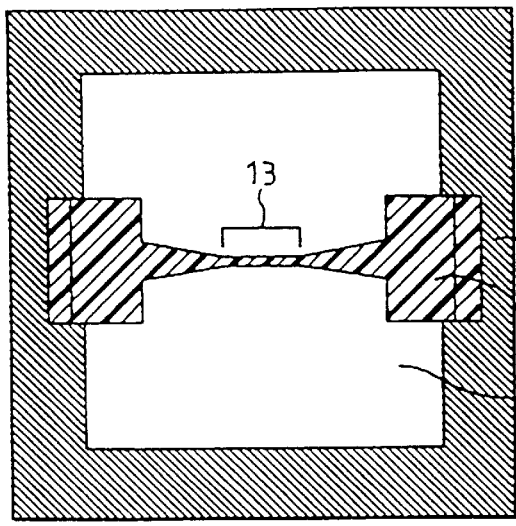
Figure 5L:
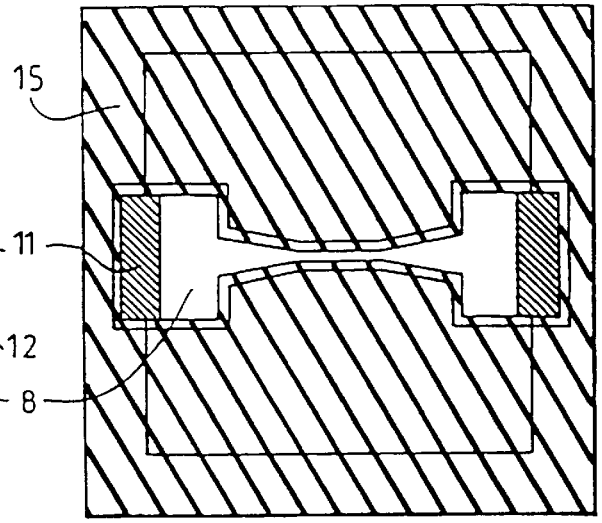
Figure 5M:
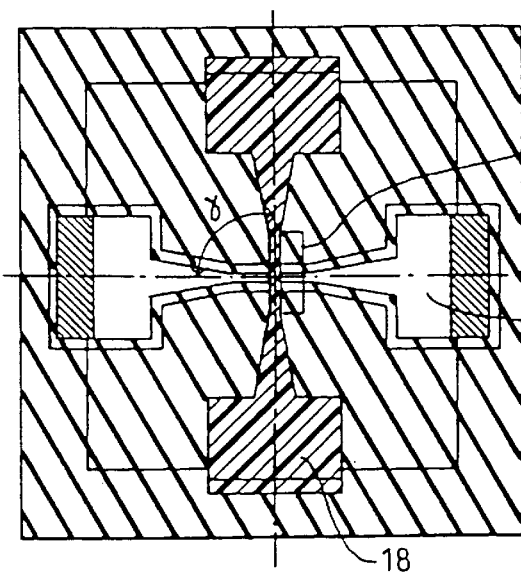
Figure 5N:
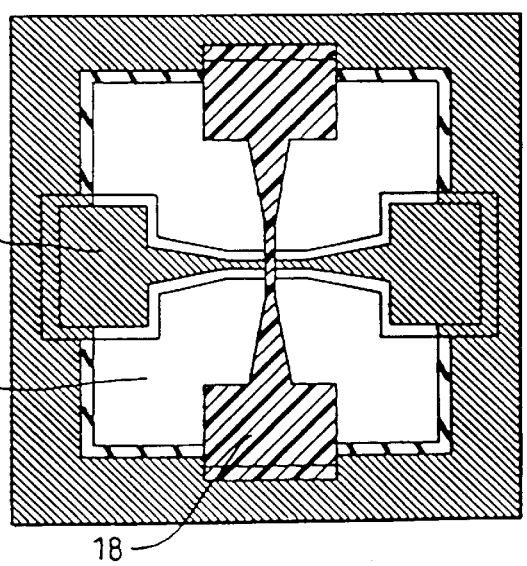

The thicknesses of machined materials are given, as an example, but could be different, especially in FIG. 5n in which we have shown a plan view of the structure after etching the second line in the case in which the machining has been carried out:
- down to the oxide layer 11 for that part of the surface 16 which is not covered by the resin of the second masking (enabling a trench 25, FIG. 5j, to be hallowed out in the lower conductor 8);
- down to the lower conductor 8 for that part of the surfaces 17 which is not covered by the resin of the second masking (Example 2).

Next, a second insulation layer is deposited on the entire structure. The mask 18 is then removed, by lift-off, as well as the insulating material lying on this mask.

Figure 5O:
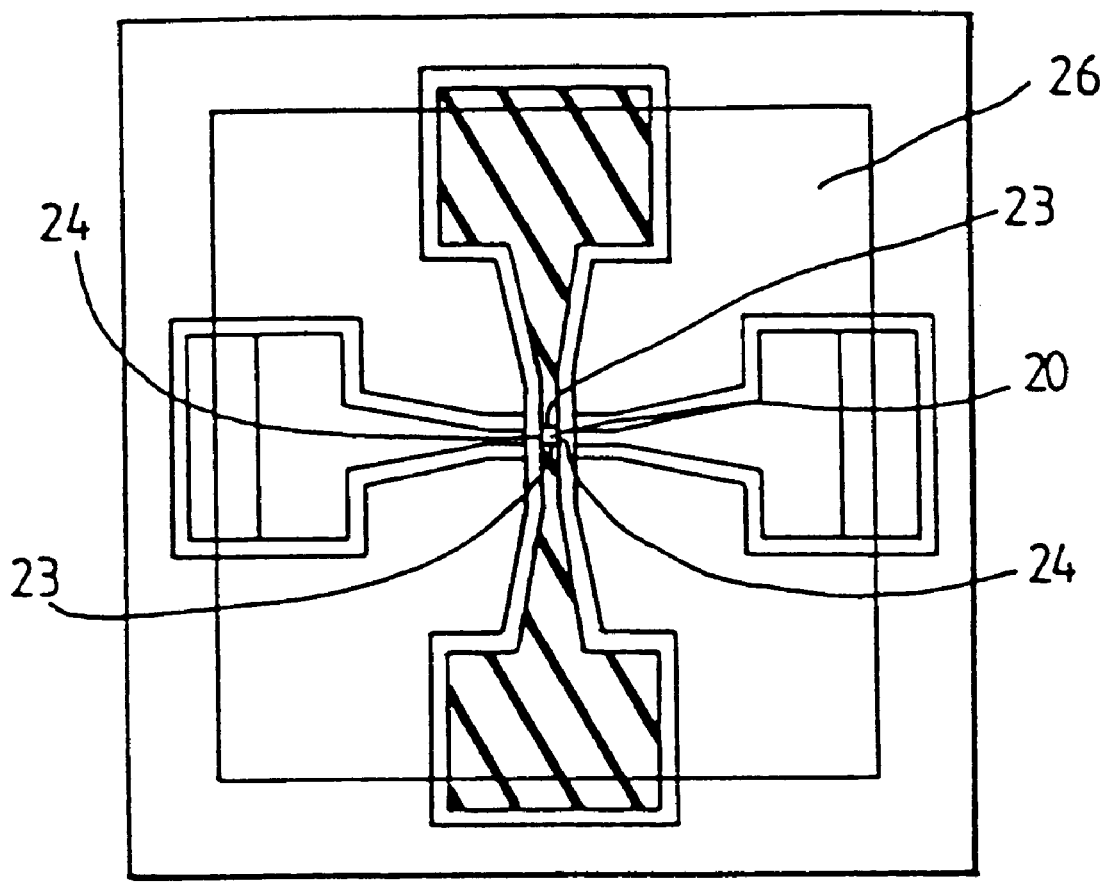
Figure 6A:
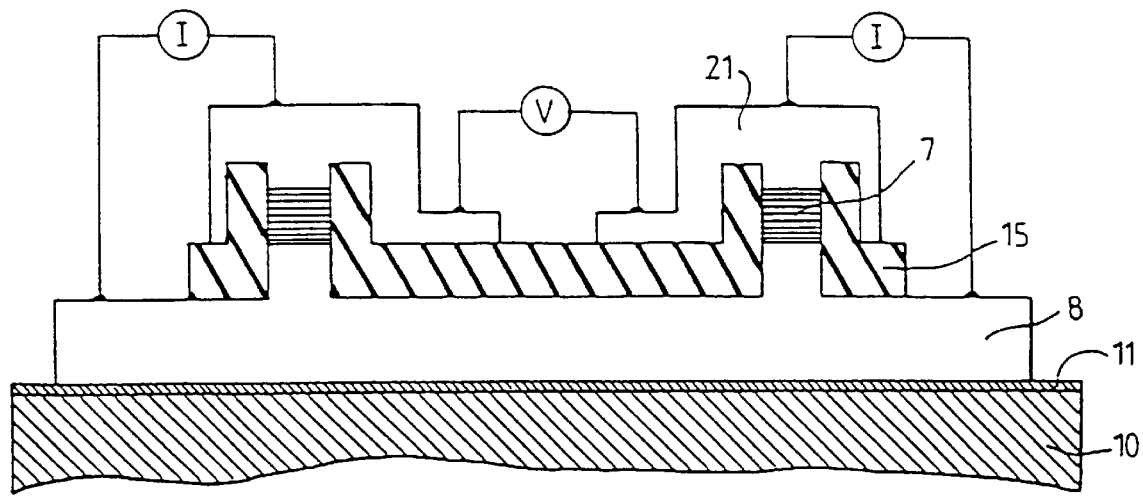
FIGS. 6A–6B respectively describe a memory cell that employs a magnetic metallic multilayer structure and equivalent circuit for the structure according to the present invention.
Figure 6B:
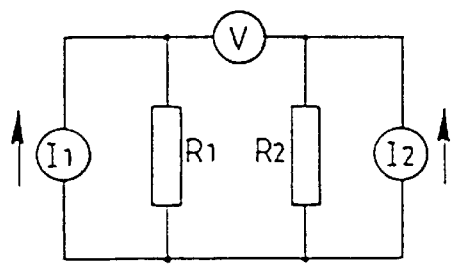

FIGS. 5f (Example 1) and 5h (Example 2) illustrate the result obtained after depositing the second insulation layer 26 and its lift-off. FIG. 5o is a plan view of the final structure.

Next, during a third operation, a contact is made on the upper face of the structure.

The various steps are:
- the cleaning of the surface 20 (FIG. 5o) of the upper conductive layer 9, for example by plasma etching;
- the deposition of a conductive layer 21 (FIGS. 4a and 4b) for making the electrical contacts. This deposition is carried out immediately after the cleaning, without exposing the component to air.

At last we obtain, at the crossing of the two lines, a pillar 22 (FIG. 5g) whose diameter (or lateral dimension) is approximately equal to the width of the lines which have enabled it to be defined. The side walls of the pillar are covered with an insulation which is deposited in two stages, the faces 23 are covered with the first insulation layer 15 and the faces 24 are covered with the second insulation layer 26 (FIGS. 5o and 5h).

During the first operation (or alternatively the second operation), the resin remaining on the top of the line defined by the first etching (or alternatively of the column defined by the second etching) is used to remove (by lift-off) the insulation which is deposited on these surfaces during the deposition of the first (or alternatively second) insulation layer, there therefore being no alignment problem during these operations since the resin used at each (first and second) operation comes from the same resin coating.

FIG. 5g is a representation of the final structure in which the second insulation layer has been omitted.

FIG. 5i (or alternatively 5j) is a cross-section (or alternatively a plan view) of FIG. 5h. For reasons of clarity, we have omitted in FIG. 5j to show the various insulation layers and contacting layers. These figures illustrate the appearance of the lower conductor, it being pointed out that the trench 25 is vertically in line with the pillar and is therefore perfectly centered on the latter.

Figure 4A:
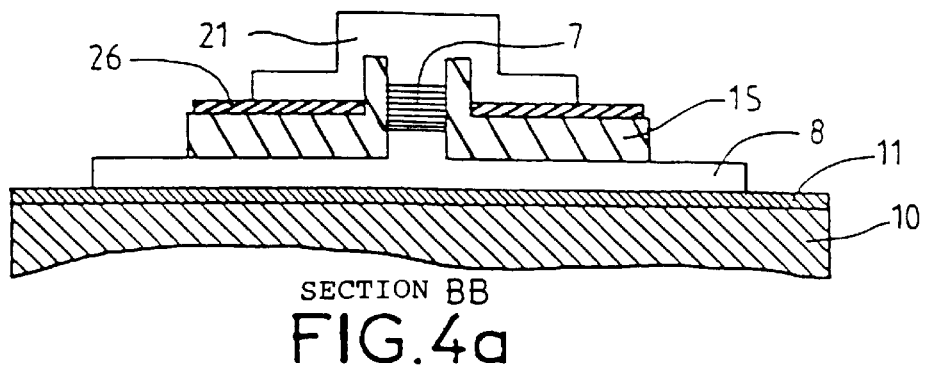
FIGS. 4a to 4e are the general process according to the invention and sections through the final structure.
Figure 4B:
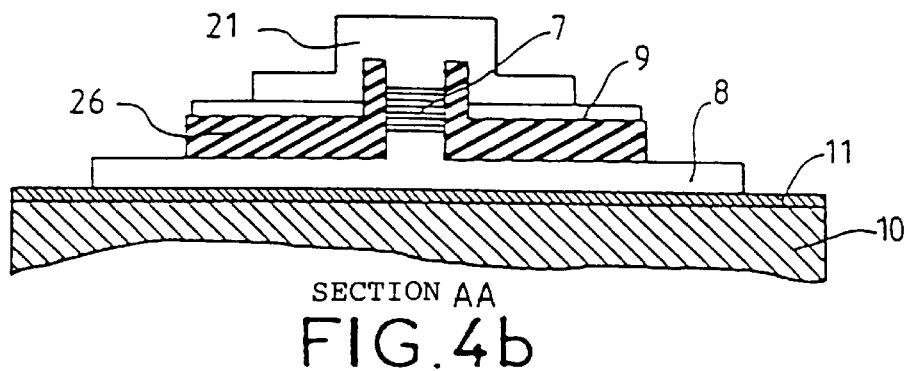
Figure 4C:
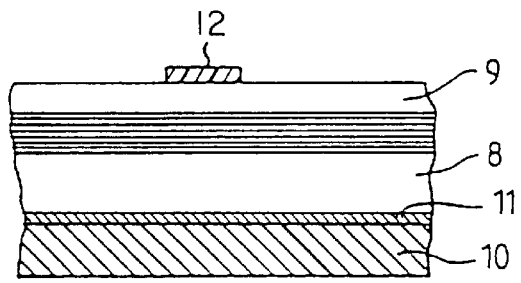
Figure 4D:
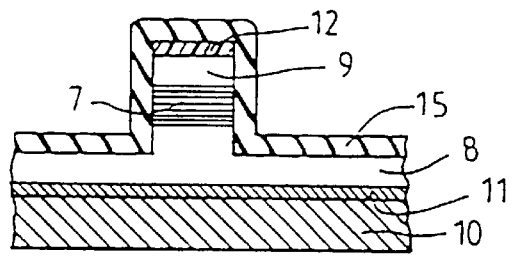
Figure 4E:
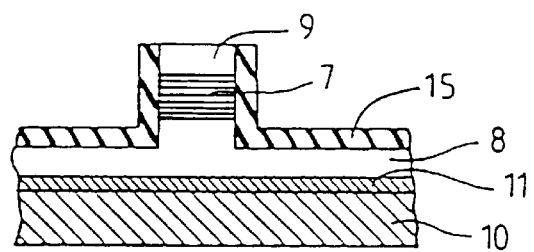

FIGS. 4a and 4b are sections through FIG. 5f after making the contacts. These sections show the various levels of the insulation layers resulting from the procedure employed.

Figure 7:
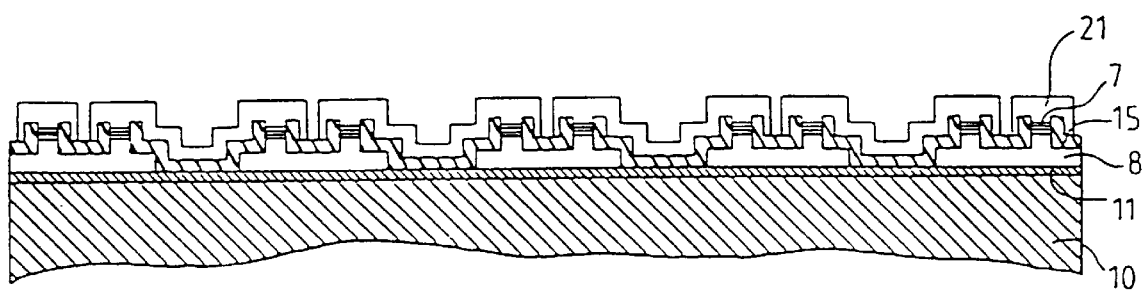
FIG. 7 represents an assembly in which several series-connected transducers are shown.

This process may be generalized to a collective fabrication of these elements. These elements may be electrically connected together or isolated from one another. FIG. 7 shows one embodiment in which ten of these elements are in series.

In order to produce such a structure, during the first operation described above, a mask 12 oriented along the line of transducers is produced. Next, during the second operation, each transducer is defined by providing masks 18 perpendicular to the line of transducers. The etching using these masks is performed down to the layer 8. After having removed the masks 18 and the insulation from the upper faces, the making of contacts on the upper faces of the transducers may be preceded by an etching operation in order to etch the layer 8 every two transducers so that the layer 8 couples every two transducers.

The transducer assembly in FIG. 7 thus produces a series of series-connected transducers.

We claim:

1. A process for producing a magnetoresistive transducer, comprising the steps of:
    stacking a magnetic metallic multilayer component on a first conductive layer to form a stack of layers and stacking said stack of layers on a substrate such that said first conductive layer contacts said substrate, said magnetic metallic multilayer component comprising alternating magnetic and non-magnetic metallic layers;
    disposing a second conductive layer on the magnetic metallic multilayer component;
    disposing a resin mask, having a dimension consistent with a magnetoresistive sensitive element to be produced as a feature of said magnetoresistive transducer, on a portion of said second conductive layer;
    etching said second conductive layer and said magnetic metallic multilayer not covered by the resin mask so as to form respective exposed portions of said second conductive layer, said magnetic metallic multilayer component and said first conductive layer;
    depositing, after performing said etching step, an insulation layer on the resin mask, and said respective exposed portions of said second conductive layer, magnetic metallic multilayer component and first conductive layer; and
    removing the resin mask and a portion of the insulation layer that covers the resin mask so as to form an electrical contact portion on said second conductive layer.

2. The process according to claim 1, wherein said etching step, comprises etching the magnetic metallic multilayer component in a polygonal shape.

3. The process according to claim 1, wherein said stacking step comprises using in the magnetic metallic multilayer component magnetic layers and non-magnetic layers having respective layer thicknesses of an inclusive range between 0.1 $\mu$m and 3 $\mu$m.

4. The process according to claim 1, wherein:
    said disposing a resin mask step comprises producing the resin mask as a first resin mask having a first elongated portion; and
    further comprising performing additional steps after the removing step, said additional steps including,
    disposing a second resin mask on said electrical contact portion of said second conductive layer,
    etching said electrical contact portion of said second conductive layer and the magnetic metallic multilayer component in areas not covered by the second resin mask,
    depositing another insulation layer, and
    removing the second resin mask and a portion of the another insulation layer that covers the second resin mask, wherein said second resin mask has a second elongated portion that is substantially perpendicular to a position of the first elongated portion.

5. The process according to claim 4, wherein respective of said etching steps comprises etching down to the first conductive layer without cutting into the first conductive layer.

6. The process according to claim 4, wherein respective of said etching steps, comprises etching at least part of the first conductive layer.

7. The process according to claim 4, wherein each of said first resin mask and said second resin mask include a large portion adjacent to said first elongated portion and said second elongated portion respectively and being larger in size than said first elongated portion and said second elongated portion, said large portion configured to simplify an execution of respective of said removing steps.

8. The process according to claim 7, wherein respective of said large portions are connected to respective of the first elongated portion and the second elongated portion by respective interconnecting regions having a shape that narrows from said large portion to respective of the first elongated portion and the second elongated portion.

9. The process according to claim 4, wherein said producing step includes producing the first elongated portion to have a length of sufficient size to enable at least two other masks to be positioned substantially perpendicular to the first elongated portion.

10. The process according to claim 1, wherein said etching step comprises etching at most only a fraction of said first conductive layer, so as to allow said first conductive layer to interconnect said transducer element to other transducer elements.

11. The process according to claim 10, further comprising the steps of:
    connecting said first conductive layer to another transducer element; and
    etching completely said first conductive layer between said transducer element and a third transducer element, so as to decouple said transducer element from said third transducer element.

12. The process according to claim 2, wherein:
    said disposing a resin mask step comprises producing the resin mask as a first resin mask having a first elongated portion; and
    further comprising performing additional steps after the removing step, said additional steps including,
    disposing a second resin mask on said electrical contact portion of said second conductive layer,
    etching said electrical contact portion of said second conductive layer and the magnetic metallic multilayer component in areas not covered by the second resin mask, depositing another insulation layer, and removing the second resin mask and a portion of the another insulation layer that covers the second resin mask, wherein said second resin mask has a second elongated portion that is substantially perpendicular to a position of the first elongated portion.

13. The process according to claim 3, wherein:

said disposing a resin mask step comprises producing the resin mask as a first resin mask having a first elongated portion; and further comprising performing additional steps after the removing step, said additional steps including, disposing a second resin mask on said electrical contact portion of said second conductive layer, etching said electrical contact portion of said second conductive layer and the magnetic metallic multilayer component in areas not covered by the second resin mask, depositing another insulation layer, and removing the second resin mask and a portion of the another insulation layer that covers the second resin mask, wherein said second resin mask has a second elongated portion that is substantially perpendicular to a position of the first elongated portion.

14. The process according to claim 13, wherein respective of said etching steps, comprises etching down to the first conductive layer, without cutting into the first conductive layer.

15. The process according to claim 13, wherein respective of said etching steps, comprises etching at least part of the first conductive layer.

16. The process according to claim 13, wherein each of said first resin mask and said second resin mask include a large portion adjacent to said first elongated portion and said second elongated portion respectively and being larger in size than said first elongated portion and said second elongated portion, said large portion configured to simplify an execution of respective of said removing steps.

17. The process according to claim 16, wherein respective of said large portions are connected to respective of the first elongated portion and the second elongated portion by respective interconnecting regions having a shape that narrows from said large portion to respective of the first elongated portion and the second elongated portion.

18. The process according to claim 12, wherein respective of said etching steps, comprises etching down to the first conductive layer, without cutting into the first conductive layer.

19. The process according to claim 12, wherein respective of said etching steps comprises etching at least part of the first conductive layer.

20. The process according to claim 12, wherein each of said first resin mask and said second resin mask include a large portion adjacent to said first elongated portion and said second elongated portion respectively and being larger in size than said first elongated portion and said second elongated portion, said large portion configured to simplify an execution of respective of said removing steps.

* * * * *